(12) United States Patent
Johnson

(10) Patent No.: US 11,440,102 B2
(45) Date of Patent: Sep. 13, 2022

(54) COATED CUTTING TOOL AND METHOD

(71) Applicant: SANDVIK INTELLECTUAL PROPERTY AB, Sandviken (SE)

(72) Inventor: Lars Johnson, Stockholm (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 1037 days.

(21) Appl. No.: 16/063,825

(22) PCT Filed: Dec. 20, 2016

(86) PCT No.: PCT/EP2016/081992
§ 371 (c)(1),
(2) Date: Jun. 19, 2018

(87) PCT Pub. No.: WO2017/108836
PCT Pub. Date: Jun. 29, 2017

(65) Prior Publication Data
US 2020/0282464 A1 Sep. 10, 2020

(30) Foreign Application Priority Data
Dec. 22, 2015 (EP) .................................. 15201981

(51) Int. Cl.
B23B 27/14 (2006.01)
C23C 14/08 (2006.01)
C23C 14/18 (2006.01)
C23C 14/32 (2006.01)
C23C 28/04 (2006.01)

(52) U.S. Cl.
CPC .............. B23B 27/14 (2013.01); C23C 14/08 (2013.01); C23C 14/185 (2013.01); C23C 14/325 (2013.01); C23C 28/044 (2013.01)

(58) Field of Classification Search
CPC ..... B23B 27/14; B23B 27/184; C23C 14/325; C23C 28/044
USPC .................................. 428/336, 697, 698, 699
See application file for complete search history.

(56) References Cited

U.S. PATENT DOCUMENTS

| 8,852,305 | B2 | 10/2014 | Andersson et al. |
| 9,334,561 | B2 | 5/2016 | Ericsson |
| 2006/0154108 | A1 | 7/2006 | Fukui et al. |
| 2006/0292399 | A1 | 12/2006 | Sjolen et al. |

(Continued)

FOREIGN PATENT DOCUMENTS

| EP | 1736565 A1 | 12/2002 |
| EP | 1710326 A1 | 10/2006 |

(Continued)

Primary Examiner — Archene A Turner
(74) Attorney, Agent, or Firm — Corinne R. Gorski

(57) ABSTRACT

A coated cutting tool includes a substrate and a coating, wherein the coating has a PVD layer being a compound of the formula $Ti_{1-x}Si_xC_aN_bO_c$, wherein $0.10<x\leq0.30$, $0\leq a\leq0.75$, $0.25\leq b\leq 1$, $0\leq c\leq 0.2$, and $a+b+c=1$. The PVD layer is a NaCl structure solid solution. The disclosure further relates to a method for producing the PVD layer by cathodic arc evaporation using a pulsed bias voltage of from about −40 to about −450 V to the substrate and using a duty cycle of less than about 12% and a pulsed bias frequency of less than about 10 kHz.

11 Claims, 4 Drawing Sheets

(56) References Cited

U.S. PATENT DOCUMENTS

| | | | | |
|---|---|---|---|---|
| 2007/0000772 A1* | 1/2007 | Ramm | ............ | H01J 37/32055 |
| | | | | 204/192.38 |
| 2010/0135738 A1* | 6/2010 | Hedin | ................. | C04B 41/5061 |
| | | | | 204/298.41 |
| 2011/0058912 A1* | 3/2011 | Johansson | ......... | C04B 35/58014 |
| | | | | 428/336 |
| 2014/0178659 A1* | 6/2014 | Wu | ........................ | C23C 28/42 |
| | | | | 428/336 |

FOREIGN PATENT DOCUMENTS

| | | | |
|---|---|---|---|
| JP | 08-118106 | * | 5/1996 |
| JP | 2009-220239 | * | 10/2009 |
| KR | 1020100015344 A | | 2/2010 |
| KR | 1020120014120 A | | 2/2012 |
| WO | 2006118513 A1 | | 11/2006 |
| WO | 2009011650 A1 | | 1/2009 |
| WO | 2010140958 A1 | | 12/2020 |

\* cited by examiner

COATED CUTTING TOOL AND METHOD

RELATED APPLICATION DATA

This application is a § 371 National Stage Application of PCT International Application No. PCT/EP2016/081992 filed Dec. 20, 2016 claiming priority to EP 15201981.6 filed Dec. 22, 2015.

TECHNICAL FIELD

The present invention relates to a coated cutting tool having a (Ti,Si)(C,N,O) layer. It also relates to a method for its production.

BACKGROUND

Physical vapour deposition (PVD) is a well-known technique to obtain wear-resistant coatings on a substrate of, e.g., a hardmetal. These coatings find applications as cutting tools for metal machining, such as inserts and drills. There are several PVD processes developed. One major process is the cathodic arc evaporation process.

PVD processes commonly used include arc evaporation, magnetron sputtering and ion plating. Advantages of the arc evaporation process over other PVD processes generally include better adhesion to an underlying substrate or layer and higher deposition rates.

However, in layers made by the arc evaporation process one normally gets lattice-defect rich coatings that when looked in magnification from above look "smeared out" without any features of separate crystal grains visible. The defects, such as point defects, lead to an increased residual compressive stress in the coating.

In sputtered layers, on the other hand, one might get lower defect density, higher crystallinity, and sometimes crystals facets on the surface.

In the arc evaporation process, an arc current is applied to a metal target or targets creating a metal vapour or plasma within a vacuum chamber. A bias voltage is applied to a substrate while a target acts as a cathode surface. An arc is ignited and a small emitting area is created where vapourised cathode material is leaving the cathode with high velocity towards the substrate. In an usual set up a target or targets of the desired metal or combination of metals to be present in the coating is used and the deposition process is performed in the presence of a reactive gas depending on which compound is to be coated. Usually as reactive gas nitrogen is used when a metal nitride is desired, methane or ethane for a metal carbide, methane or ethane together with nitrogen for a metal carbonitride, and further addition of oxygen for depositing a metal carboxynitride.

The bias voltage applied to the substrate to be coated can be applied in DC mode or time varying mode. The time varying mode can be pulsed mode, where the voltage is varied over time, for example by having alternating bias voltage turned on and bias voltage turned off. The percentage "on-time", i.e., the time during which the bias is applied, out of the total time for a bias pulse period during a deposition is called the "duty cycle".

The frequency of the bias voltage in pulsed mode can also be varied and is normally expressed in kHz.

Although there are many times desired a certain level of compressive residual stress in a PVD layer, it should preferably not be too high due to risk of adverse effects on adhesion to an underlying layer or substrate.

(Ti,Si)N coatings are commonly used in the area of cutting tools for metal machining. (Ti,Si)N is an intensively studied materials system. For example, Flink et al., describes that the Si content is the main defining parameter for the microstructure of (Ti,Si)N coatings. For x≤0.1 (in $Ti_{1-x}Si_xN$) a conventional coating is columnar and in a NaCl solid solution state, while for x≤0.1 the growth changes to a nanocomposite growth with Ti(Si)N nanocolumns in a Si(Ti)$N_x$ matrix phase (tissue phase). The thickness of the tissue phase depends on the Si content but is regularly in the order of 1-5 nm.

There is a continuing demand for (Ti,Si)N coated cutting tools in which the coating has excellent properties in terms of adhesion to the substrate and flaking resistance, and also excellent wear resistance, such as crater wear resistance and/or flank wear resistance.

There is, furthermore, a need for an arc evaporation deposited (Ti,Si)N layer which besides having the general benefits from an arc evaporation deposited layer, such as good adhesion to the substrate, furthermore has a low level of lattice defects, such as low point defect density.

SUMMARY

The present disclosure relates to a coated cutting tool having a substrate and a coating, wherein the coating includes a PVD layer (A) being a compound of the formula of the formula $Ti_{1-x}Si_xC_aN_bO_c$, wherein 0.10<x≤0.30, 0≤a≤0.75, 0.25≤b≤1, 0≤c≤0.2, and a+b+c=1, and wherein the PVD layer (A) is a NaCl structure solid solution.

A method for producing a coating on a substrate is also provided, wherein the coating includes a PVD layer (A) deposited by cathodic arc evaporation, and being a compound of the formula $Ti_{1-x}Si_xC_aN_bO_c$, wherein 0.10<x≤0.30, 0≤a0.75, 0.25≤b≤1, 0≤c≤0.2, and a+b+c=1. The PVD layer (A) is a NaCl structure solid solution. The PVD layer (A) is deposited by applying a pulsed bias voltage of from about −40 to about −450 V to the substrate and using a duty cycle of less than about 12% and a pulsed bias frequency of less than about 10 kHz.

DEFINITIONS

By the term "duty cycle" is meant the percentage of time that the bias voltage is "on", i.e., active, during a complete pulse period ("on-time"+"off-time").

By the term "pulse bias frequency" is meant the number of complete pulse period per second.

By the term "FWHM" is meant "Full Width at Half Maximum", which is the width, in degrees (2theta), of an X-ray diffraction peak at half its peak intensity.

By the term "FWQM" is meant "Full Width at Quarter Maximum", which is the width, in degrees (2theta), of an X-ray diffraction peak at a quarter of its peak intensity.

BRIEF DESCRIPTIONS OF THE DRAWINGS

DETAILED DESCRIPTION

Figure 1:
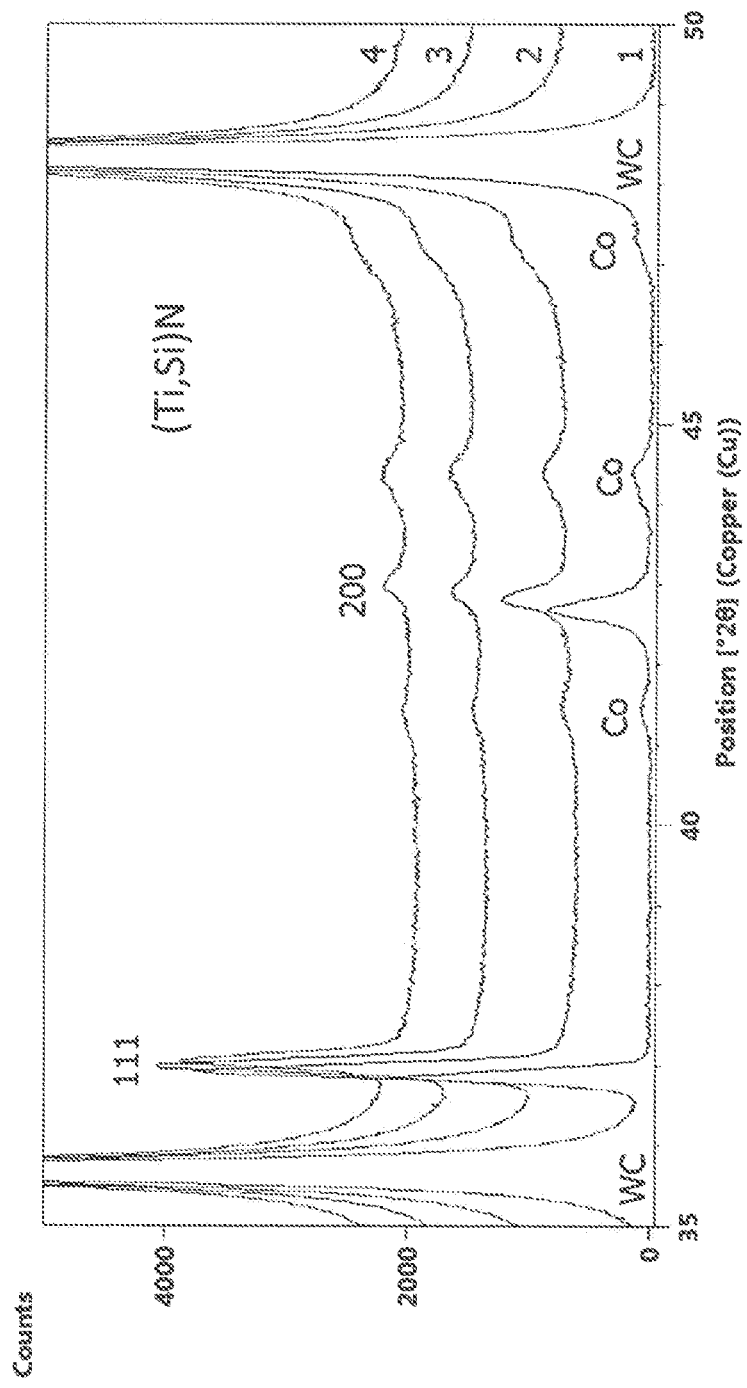
FIG. 1 shows combined X-ray diffractograms for the coatings of Samples 1-4.

It has now surprisingly been found that (Ti,Si)N PVD layers having a higher content of Si while still remaining in a solid solution and thus not entering into a nanocrystalline state can be provided.

The present invention relates to a coated cutting tool comprising a substrate and a coating, wherein the coating comprises a PVD layer (A) being a compound of the formula $Ti_{1-x}Si_xC_aN_bO_c$, $0.10<x\leq0.30$, $0\leq a\leq0.75$, $0.25\leq b\leq1$, $0\leq c\leq0.2$, $a+b+c=1$, wherein the PVD layer (A) is a NaCl structure solid solution.

In the formula $Ti_{1-x}Si_xC_aN_bO_c$, suitably $0.11\leq x\leq0.27$, or $0.12\leq x\leq0.25$, or $0.13\leq x\leq0.24$, or $0.14\leq x\leq0.23$, or $0.15\leq x\leq0.22$, or $0.16\leq x\leq0.22$, or $0.17\leq x\leq0.22$.

In the formula $Ti_{1-x}Si_xC_aN_bO_c$, suitably, $0\leq a\leq0.5$, $0.5\leq b\leq1$, $0\leq c\leq0.1$, or, $0\leq a\leq0.25$, $0.75\leq b\leq1$, $0\leq c\leq0.05$, or, $0\leq a\leq0.1$, $0.9\leq b\leq1$, $0\leq c\leq0.02$, or, $a=0$, $b=1$, $c=0$, $a+b+c=1$.

The presence of a NaCl structure solid solution of the PVD layer (A) can be detected by, for example, TEM (Transmission Electron Microscopy) analysis.

The present invention further relates to a method for producing a coating on a substrate, wherein the coating comprises a PVD layer (A), deposited by cathodic arc evaporation, being a compound of the formula $Ti_{1-x}Si_xC_aN_bO_c$, $0.10<x\leq0.30$, $0\leq a\leq0.75$, $0.25\leq b\leq1$, $0\leq c\leq0.2$, $a+b+c=1$, and wherein the PVD layer (A) is a NaCl structure solid solution, the PVD layer (A) is deposited by applying a pulsed bias voltage of from about −40 to about −450 V to the substrate and using a duty cycle of less than about 12% and a pulsed bias frequency of less than about 10 kHz.

In one embodiment the duty cycle can be less than about 11%. The duty cycle can further be from about 1.5 to about 10%, or from about 2 to about 10%.

In one embodiment the duty cycle can be less than about 10%. The duty cycle can further be from about 1.5 to about 8%, or from about 2 to about 6%.

During the "off-time" the potential is suitably floating.

The pulsed bias frequency can be more than about 0.1 kHz, or from about 0.1 to about 8 kHz, or from about 1 to about 6 kHz, or from about 1.5 to about 5 kHz, or from about 1.75 to about 4 kHz.

The pulsed bias voltage can be from about −40 to about −450 V, or from about −50 to about −450 V.

The most optimal range for the pulsed bias voltage to be used may vary depending on the specific PVD reactor used.

In one embodiment the pulsed bias voltage can be from about −55 to about −400 V, or from about −60 to about −350 V, or from about −70 to about −325 V, or from about −75 to about −300 V, or from about −75 to about −250 V, or from about −100 to about −200 V.

In another embodiment the pulsed bias voltage can be from about −45 to about −400 V, or from about −50 to about −350 V, or from about −50 to about −300 V, The pulsed bias voltage is suitably unipolar.

The PVD layer (A) is suitably deposited at a chamber temperature of between 400 and 700° C., or between 400-600° C., or between 450-550° C.

The PVD layer (A) is suitably deposited in a PVD vacuum chamber as disclosed in US 2013/0126347 A1 equipped with cathode assemblies where the cathodes are both provided with a ring-shaped anode placed around them, and using a system providing a magnetic field with field lines going out from the target surface and entering the anode.

The gas pressure during the deposition of the PVD layer (A) can be from about 0.5 to about 15 Pa, or from about 0.5 to about 10 Pa, or from about 1 to about 5 Pa.

The substrate can be selected from the group of cemented carbide, cermet, ceramic, cubic boron nitride and high speed steel.

The substrate is suitably shaped as a cutting tool.

The cutting tool can be a cutting tool insert, a drill, or a solid end-mill, for metal machining.

The further possible features of the PVD layer (A) described herein refer to both the PVD layer (A) defined in the coated cutting tool and to the PVD layer (A) defined in the method.

Very sharp diffraction peaks are seen when performing X-ray diffraction analysis of the PVD layer (A). This implies high crystallinity. One also suitably gets a preferred (111) out-of-plane crystallographic orientation.

The PVD layer (A) suitably has a FWHM value for the cubic (111) peak in XRD diffraction being ≤0.4 degrees (2theta), or ≤0.35 degrees (2theta), or ≤0.3 degrees (2theta), or ≤0.25 degrees (2theta), or ≤0.2 degrees (2theta), or ≤0.18 degrees (2theta).

The PVD layer (A) suitably has a FWQM (Full Width at Quarter Maximum) value for the cubic (111) peak in XRD diffraction being ≤0.45 degrees (2theta), or ≤0.4 degrees (2theta), or ≤0.35 degrees (2theta), or ≤0.3 degrees (2theta).

The PVD layer (A) suitably has a FWHM value for the cubic (200) peak in XRD diffraction being ≤0.5 degrees (2theta), or ≤0.45 degrees (2theta), or ≤0.4 degrees (2theta), or ≤0.35 degrees (2theta).

The PVD layer (A) suitably has a ratio of peak height intensity I(111)/I(200) in X-ray diffraction being ≥0.3, or ≥0.5, or ≥0.7, or ≥0.8, or ≥0.9, or ≥1, or ≥1.5, or ≥2, or ≥3, or ≥4.

The peak height intensites I(111) and I(200) used herein, as well as the (111) peak used for determining the FWHM and FWQM values are $Cu-K_{\alpha 2}$ stripped.

The PVD layer (A), suitably has a residual stress being >−3 GPa, or >−2 GPa, or >−1 GPa, or >−0.5 GPa, or >−0 GPa.

The PVD layer (A), suitably has a residual stress being <4 GPa, or <3 GPa, or <2 GPa, or <1.5 GPa, or <1 GPa.

The residual stress of the PVD layer (A) is evaluated by X-ray diffraction measurements using the well-known $\sin^2\psi$ method as described by I. C. Noyan, J. B. Cohen, Residual Stress Measurement by Diffraction and Interpretation, Springer-Verlag, N.Y., 1987 (pp 117-130). See also for example V Hauk, Structural and Residual Stress analysis by Nondestructive Methods, Elsevier, Amsterdam, 1997. The measurements are performed using CuKα-radiation on the (200) reflection. The side-inclination technique (ψ-geometry) has been used with six to eleven, preferably eight, ψ-angles, equidistant within a selected $\sin^2\psi$-range. An equidistant distribution of φ-angles within a φ-sector of 90° is preferred. To confirm a biaxial stress state, the sample shall be rotated for φ=0 and 90° while tilted in ψ. It is recommended to investigate the possible presence of shear stresses and therefore both negative and positive ψ-angles shall be measured. In the case of an Euler ¼-cradle this is accomplished by measuring the sample also at φ=180 and 270° for the different ψ-angles. The measurement shall be performed on an as flat surface as possible, preferably on a flank side of a cutting tool insert. For the calculations of the residual stress values the Possion's ratio, v=0.22 and the Young's modulus, E=447 GPa are to be used. The data is evaluated using commercially available software such as $DIFFRAC^{Plus}$ Leptos v. 7.8 from Bruker AXS preferably locating the (200) reflection, by the Pseudo-Voigt-Fit function. The total stress value is calculated as the average of the obtained biaxial stresses.

The PVD layer (A) suitably comprises faceted crystal grains on its surface. By faceted is herein meant that there are flat faces on the grains.

The faceted crystal grains of the PVD layer (A) suitably occupy >50%, or >75%, or >90%, of the surface area of the PVD layer (A).

The thickness of the PVD layer (A) is suitably from about 0.5 to about 20 µm, or from about 0.5 to about 15 µm, or from about 0.5 to about 10 µm, or from about 1 to about 7 µm, or from about 2 to about 5 µm.

The PVD layer (A) is suitably an arc evaporation deposited layer

The PVD layer (A) is suitably deposited according to the method of the invention.

In one embodiment the coating comprises an innermost bonding layer of, e.g., TiN, CrN or ZrN, closest to the substrate. The thickness of the bonding layer can be from about 0.1 to about 1 µm, or from about 0.1 to about 0.5 µm.

In one embodiment the coating comprises an innermost bonding layer of, e.g., TiN, CrN or ZrN, closest to the substrate. The thickness of the bonding layer can be from about 0.1 to about 1 µm, or from about 0.1 to about 0.5 µm. An innermost bonding layer may be deposited using different process parameters than used for depositing the PVD layer (A), for example DC bias instead of pulsed bias, such an innermost bonding layer may be of substantially the same elemental composition as the PVD layer (A).

The substrate of the coated cutting tool can be selected from the group of cemented carbide, cermet, ceramic, cubic boron nitride and high speed steel.

The coated cutting tool can be a cutting tool insert, a drill, or a solid end-mill, for metal machining.

EXAMPLES

Example 1:

A (Ti,Si)N layer was deposited on sintered cemented carbide cutting tool insert blanks of the geometry SNMA120804. The composition of the cemented carbide was 10 wt % Co, 0.4 wt % Cr and rest WC. The cemented carbide blanks were coated in a PVD vacuum chamber being Oerlikon Balzer INNOVA System with the Advanced Plasma Optimizer upgrade. The PVD vacuum chamber was equipped with 6 cathode assemblies. The assemblies each comprised one Ti-Si alloy target. The cathode assemblies were placed on two levels in the chamber. The cathodes were both provided with a ring-shaped anode placed around them (as disclosed in US 2013/0126347 A1), with a system providing a magnetic field with field lines going out from the target surface and entering the anode (see US 2013/0126347 A1).

The chamber was pumped down to high vacuum (less than $10^{-2}$ Pa) and heated to 350-500° C. by heaters located inside the chamber, in this specific case 500° C. The blanks were then etched for 30 minutes in an Ar plasma.

Four different depositions were made with varying the relation Ti to Si in the targets. The targets used were $Ti_{0.9}Si_{0.10}$, $Ti_{0.85}Si_{0.15}$, $Ti_{0.80}Si_{0.20}$, and $Ti_{0.75}Si_{0.25}$.

The chamber pressure (reaction pressure) was set to 3.5 Pa of $N_2$ gas, and a unipolar pulsed bias voltage of −300 V (relative to the chamber walls) was applied to the blank assembly. The pulsed bias frequency was 1.9 kHz and the duty cycle 3.8% ("on-time" 20 µs, "off-time" 500 µs). The cathodes were run in an arc discharge mode at a current of 150 A (each) for 120 minutes. A layer having a thickness of about 3 µm was deposited.

The actual compositions of the deposited PVD layers were measured using EDX (Energy Dispersive Spectroscopy) and were $Ti_{0.91}Si_{0.09}N$, $Ti_{0.87}Si_{0.13}N$, $Ti_{0.82}Si_{0.18}N$ and $Ti_{0.78}Si_{0.22}N$, respectively.

X-ray diffraction (XRD) analysis was conducted on the flank face of the coated inserts using a Bruker D8 Discover diffractometer equipped with a 2D detector (VANTEC-500) and a IµS X-ray source (Cu-K$_α$, 50.0 kV, 1.0 mA) with an integrated parallel beam Montel mirror. The coated cutting tool inserts were mounted in sample holders that ensure that the flank face of the samples were parallel to the reference surface of the sample holder and also that the flank face was at appropriate height. The diffracted intensity from the coated cutting tool was measured around 2θ angles where relevant peaks occur, so that at least 35° to 50° is included. Data analysis, including background subtraction and Cu-K$_{α2}$ stripping, was performed using PANalytical's X'Pert HighScore Plus software. A Pseudo-Voigt-Fit function was used for peak analysis. No thin film correction was applied to the obtained peak intensities. Possible peak overlap of a (111) or a (200) peak with any diffraction peak not belonging to the PVD layer, e.g., a substrate reflection like WC, was compensated for by the software (deconvolution of combined peaks) when determining the peak intensities and peak widths.

Figure 2:
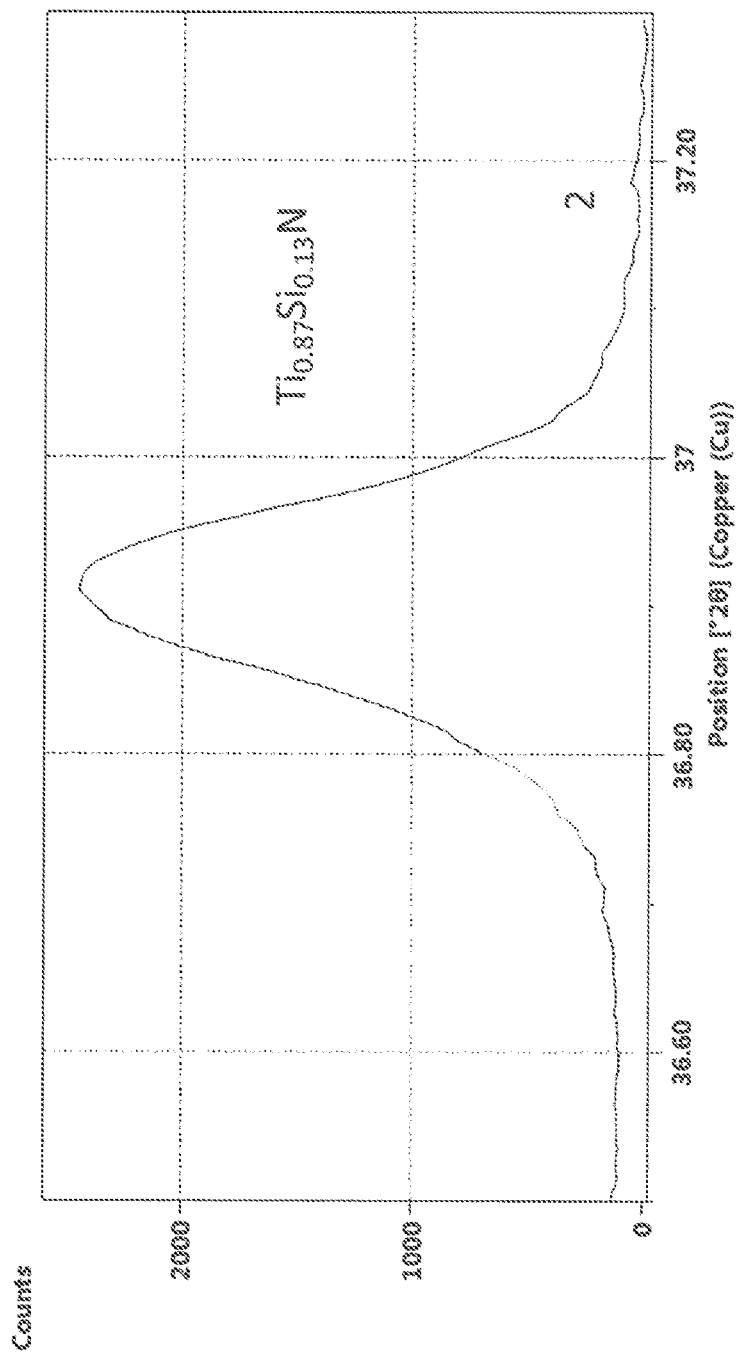
FIG. 2 shows an enlarged part of the X-ray diffractogram for Sample 2 around the (111) peak.
Figure 3:
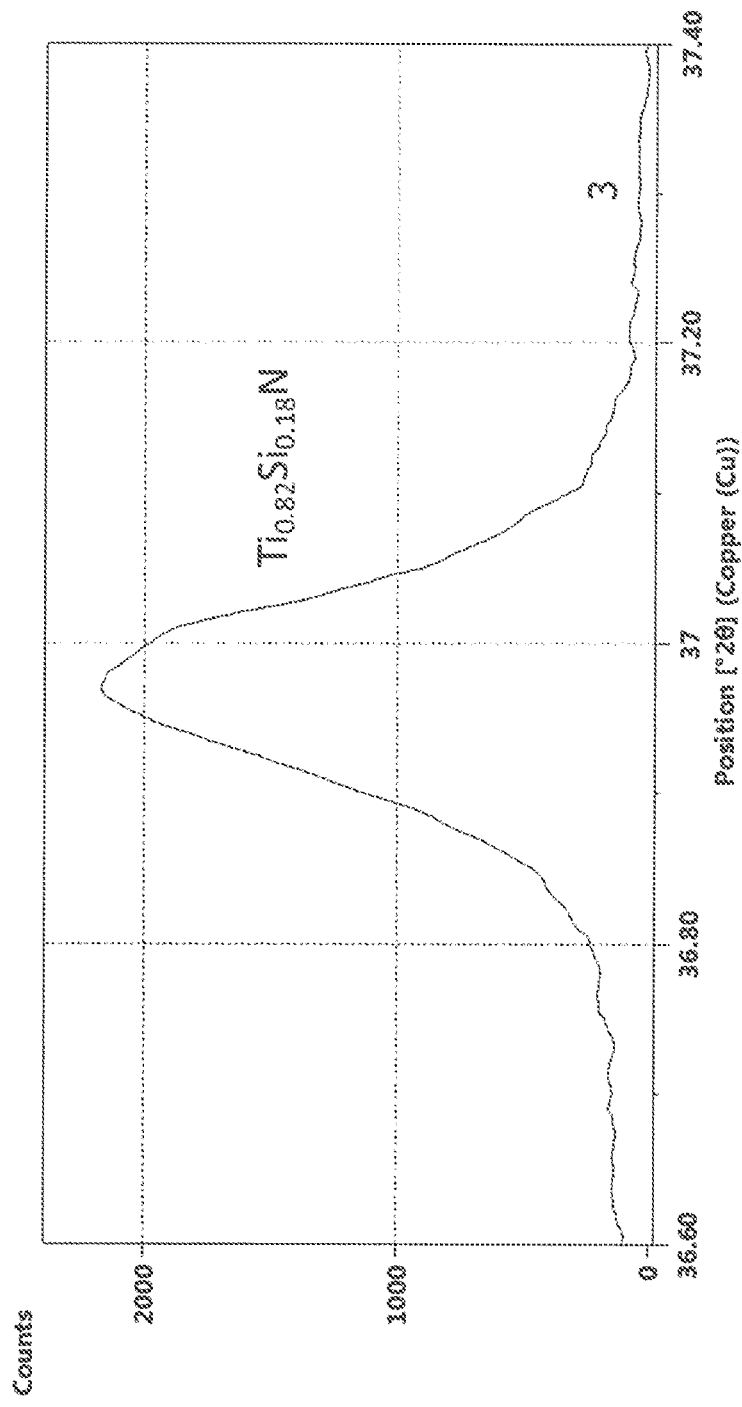
FIG. 3 shows an enlarged part of the X-ray diffractogram for Sample 3 around the (111) peak.
Figure 4:
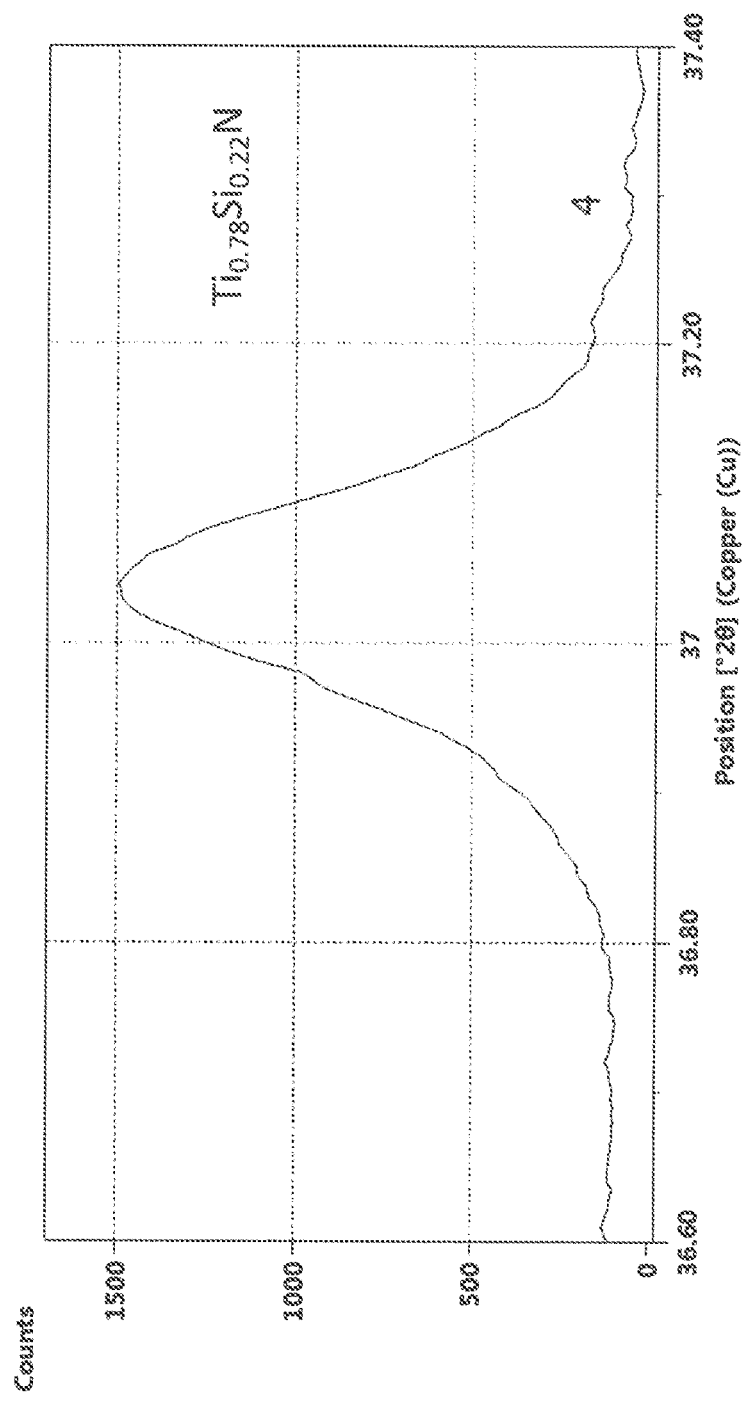
FIG. 4 shows an enlarged part of the X-ray diffractogram for Sample 4 around the (111) peak.

FIG. 1 shows a combined X-ray diffractogram (not Cu-K$_{α2}$ stripped) for the coatings Samples 1-4 showing a sharp (111) peak. The change of the position of the (111) peak as the Si content increases in the PVD layer is also clearly seen. This is an evidence of that there is a change in the lattice parameter while still retaining the NaCl structure, i.e. there is a (Ti,Si)N solid solution for all samples. FIG. 2-4 show enlarged parts of the diffractograms (Cu-K$_{α2}$ stripped) for Samples 2-4 around the (111) peak.

The FWHM and FWQM values for the samples were calculated.

The results are shown in Table 1.

TABLE 1

Results from SEM analysis and XRD analysis

| Sample No. | PVD layer composition | Facetted crystal grains on the surface | I(111)/ I(200), peak height intensities | FWHM I(111), [°2θ] | FWQM I(111), [°2θ] |
|---|---|---|---|---|---|
| 1. (comparative) | $Ti_{0.91}Si_{0.09}N$ | yes, all over | 3.8 | 0.15 | 0.30 |
| 2. (invention) | $Ti_{0.87}Si_{0.13}N$ | yes, all over | 11.1 | 0.16 | 0.32 |
| 3. (invention) | $Ti_{0.82}Si_{0.18}N$ | yes, all over | 10.2 | 0.15 | 0.31 |
| 4. (invention) | $Ti_{0.78}Si_{0.22}N$ | yes, all over | 9.9 | 0.16 | 0.35 |

Example 2:

A new set of (Ti,Si)N coated cutting tools was provided by depositing (Ti,Si)N on sintered cemented carbide cutting tool insert blanks of the same composition and geometry SNMA120804 as in Example 1, but now using a slightly different equipment.

Sintered cemented carbide cutting tool insert blanks of the same composition and geometry SNMA120804 as used in Example 1 were provided.

The (Ti,Si)N layer was deposited by cathodic arc evaporation in a vacuum chamber of another manufacturer than in Example 1. The vacuum chamber comprised four arc flanges. Targets of the selected TiSi composition were mounted in all of the flanges opposite each other. All targets having the same TiSi composition. The uncoated blanks were mounted on pins that undergo a three-fold rotation in the PVD chamber.

Depositions were made varying the relation Ti to Si in the targets. The targets used were $Ti_{0.90}Si_{0.10}$, $Ti_{0.85}Si_{0.15}$, and $Ti_{0.80}Si_{0.20}$. Three coatings (samples 5-7) with different Si contents were made according to the herein claimed method using pulsed bias, see process parameters used in Table 2.

First, an innermost thin (about 0.1 μm) (Ti,Si)N layer was deposited using DC bias. The process parameters are seen in Table 2.

TABLE 2

| N2 Pressure | Bias Voltage | Bias type | Arc current | Deposition time | Temp. |
|---|---|---|---|---|---|
| 4 Pa | 50 V | DC | 150 A | 5 min | around 500° C. |

Secondly, the main layer of (Ti,Si)N was for samples 5-7 deposited using pulsed bias. The process parameters are seen in Table 3.

TABLE 3

| N2 Pressure | Bias Voltage | Bias type | Pulse frequency | Duty cycle | Arc current | Deposition time | Temp. |
|---|---|---|---|---|---|---|---|
| 10 Pa | 50 V | pulsed | 2 kHz | 10% | 150 A | 75 min | around 500° C. |

An intermediate step between the innermost DC mode deposition and the deposition of the main layer with pulsed mode was used which comprised continuing the initial DC mode deposition but ramping the pressure from 4 Pa to 10 Pa and also ramping the DC mode into the pulsed mode to be used for the main layer. The ramping time was 10 minutes.

The layer thickness of the innermost (Ti,Si)N layer (DC-deposited+ramped) was about 0.1 μm.

The layer thickness of the main (Ti,Si)N layer was for each sample about 2.5 μm.

Then three further samples 8-10 with different Si contents were made by depositing onto blanks a (Ti,Si)N layer using a process with DC bias for the whole layer, see process parameters used in Table 4.

TABLE 4

| N2 Pressure | Bias Voltage | Bias type | Arc current | Deposition time | Temp. |
|---|---|---|---|---|---|
| 4 Pa | 50 V | DC | 150 A | 75 min | around 500° C. |

The layer thickness of the (Ti,Si)N was for each sample about 2.5 μm.

X-ray diffraction (XRD) analysis was conducted on the flank face of the coated inserts using the same equipment and procedure as in the previous examples.

The FWHM values for the (111) peak and (200) peak of the samples were determined as well as the ratio of I(111)/I(200).

The results are shown in Table 5.

TABLE 5

Results from XRD analysis

| Sample No. | PVD layer composition* | I(111)/I(200), peak height intensities | FWHM I(111), [°2θ] | FWHM I(200), [°2θ] | Position (111) peak [2θ] | Position (200) peak [2θ] | Type |
|---|---|---|---|---|---|---|---|
| 5 | $Ti_{0.90}Si_{0.10}N$ | 0.4 | 0.19 | 0.26 | 37.06 | 42.98 | NaCl solid solution |
| 6 | $Ti_{0.85}Si_{0.15}N$ | 0.3 | 0.19 | 0.26 | 37.11 | 43.04 | NaCl solid solution |
| 7 | $Ti_{0.80}Si_{0.20}N$ | 0.4 | 0.18 | 0.30 | 37.18 | 43.12 | NaCl solid solution |
| 8 | $Ti_{0.90}Si_{0.10}N$ | 0 | no peak | 0.59 | no peak | 42.73 | nano-composite |
| 9 | $Ti_{0.85}Si_{0.15}N$ | 0 | no peak | 0.67 | no peak | 42.75 | nano-composite |
| 10 | $Ti_{0.80}Si_{0.20}N$ | 0 | no peak | 0.83 | no peak | 42.80 | nano-composite |

*based on target composition

The broader (200) peak for samples 8-10 in general when comparing with samples 5-7, and also when increasing the Si content, indicates a much more nanocrystalline microstructure.

The invention claimed is:

1. A coated cutting tool comprising a substrate and a coating, wherein the coating includes a PVD layer being a compound of the formula $Ti_{1-x}Si_xC_aN_bO_c$, wherein $0.10 < x \leq 0.30$, $0 \leq a \leq 0.75$, $0.25 \leq b \leq 1$, $0 \leq c \leq 0.2$, and $a+b+c=1$, wherein the PVD layer is a NaCl structure solid solution and wherein the PVD layer has a FWHM (Full Width at Half Maximum) value for the cubic (111) peak in X-ray diffraction being ≤0.35 degrees (2theta).

2. The coated cutting tool according to claim 1, wherein in the formula $Ti_{1-x}Si_xC_aN_bO_c$, $0.12 \leq x \leq 0.25$.

3. The coated cutting tool according to claim 1, wherein the FWHM value for the cubic (111) peak in X-ray diffraction is ≤0.25 degrees (2theta).

4. The coated cutting tool according to claim 1, wherein the PVD layer has a residual stress being >−3 GPa.

5. The coated cutting tool according to claim 1, wherein the PVD layer includes faceted crystal grains on its surface.

6. The coated cutting tool according to claim 1, wherein a thickness of the PVD layer is from about 0.5 to about 20 µm.

7. The coated cutting tool according to claim 1, wherein the PVD layer is an arc evaporation deposited layer.

8. A method for producing a coating on a substrate, the coating including a PVD layer deposited by cathodic arc evaporation, the PVD layer being a compound of the formula $Ti_{1-x}Si_xC_aN_bO_c$, wherein $0.10 < x \leq 0.30$, $0 \leq a \leq 0.75$, $0.25 \leq b \leq 1$, $0 \leq c \leq 0.2$, and $a+b+c=1$, and wherein the PVD layer is a NaCl structure solid solution and wherein the PVD layer has a FWHM (Full Width at Half Maximum) value for the cubic (111) peak in X-ray diffraction being $\leq 0.35$ degrees (2theta), the PVD layer being deposited by applying a pulsed bias voltage of from about −40 to about −450 V to the substrate and using a duty cycle of less than about 12% and a pulsed bias frequency of less than about 10 kHz.

9. The method according to claim 8, wherein the duty cycle is from about 2 to about 10%.

10. The method according to claim 8, wherein the pulsed bias frequency is from about 0.1 to about 8 kHz.

11. The method according to claim 8, wherein the pulsed bias voltage is from about −50 to about −350 V.

\* \* \* \* \*